(12) United States Patent
Beavers (10) Patent No.: US 9,715,705 B2
(45) Date of Patent: Jul. 25, 2017

(54) SUNGLASS TESTING STATION (71) Applicant: Colton Beavers, Hoover, AL (US)

(72) Inventor: Colton Beavers, Hoover, AL (US)

( * ) Notice: Subject to any disclaimer, the term of this patent is extended or adjusted under 35 U.S.C. 154(b) by 0 days.

(21) Appl. No.: 14/823,279

(22) Filed: Aug. 11, 2015

(65) Prior Publication Data
US 2015/0348156 A1 Dec. 3, 2015

Related U.S. Application Data

(63) Continuation-in-part of application No. 14/077,762, filed on Nov. 12, 2013, now abandoned.

(60) Provisional application No. 61/726,236, filed on Nov. 14, 2012.

(51) Int. Cl.
| | |
|---|---|
| *G01N 21/00* | (2006.01) |
| *G06Q 30/06* | (2012.01) |
| *G02C 13/00* | (2006.01) |
| *G02C 7/10* | (2006.01) |
| *H05K 5/00* | (2006.01) |
| *H05K 5/02* | (2006.01) |

(52) U.S. Cl.
CPC ........... *G06Q 30/0623* (2013.01); *G02C 7/10* (2013.01); *G02C 13/003* (2013.01); *H05K 5/0017* (2013.01); *H05K 5/0217* (2013.01)

(58) Field of Classification Search
CPC ......... A61B 3/00; G01M 11/00; G01N 21/00; G02F 1/00; G02C 3/00; G02B 5/00
USPC ............... 356/239.2, 124, 503; 351/246, 206
See application file for complete search history.

(56) References Cited

U.S. PATENT DOCUMENTS

| | | | | |
|---|---|---|---|---|
| 5,671,091 A | * | 9/1997 | Monroe ............... | G02B 27/144 108/10 |
| 2008/0319323 A1 | * | 12/2008 | Gravely ................. | A61B 3/101 600/476 |
| 2010/0253907 A1 | * | 10/2010 | Korb .................... | A61B 3/0025 351/206 |

* cited by examiner

*Primary Examiner* — Tarifur Chowdhury
*Assistant Examiner* — Isiaka Akanbi
(74) *Attorney, Agent, or Firm* — Jeremy A. Smith; Kathleen M. Best; Bradley Arant Boult Cummings LLP (57) ABSTRACT

The present disclosure provides a sunglass testing station that is useful for determining the effectiveness and desirability of a pair of sunglasses in "real world" environments. In one embodiment, the sunglass testing station comprises a base, a vertical member, and a viewing box. In other aspects, the sunglass testing station comprises a base, a handheld viewing sphere, a visual display, and interactive simulation components.

7 Claims, 8 Drawing Sheets

SUNGLASS TESTING STATION

CROSS REFERENCE TO RELATED APPLICATIONS

This application is a continuation-in-part of and therefore claims priority to, and the benefit of, currently pending U.S. patent application Ser. No. 14/077,762 filed Nov. 12, 2013 entitled "Sunglass Testing Station" which in turn was a Non-Provisional of and therefore claimed priority to, and the benefit of, U.S. Provisional Application No. 61/726,236 filed Nov. 14, 2012 entitled "Sunglass Testing Station."

FIELD OF THE DISCLOSURE

The present disclosure relates to the field of testing eyewear for "real world" effectiveness. In one embodiment, the eyewear is sunglasses.

BACKGROUND

Sunglasses made up 10.3 percent of the $32 billion vision care industry as of 2010. There exists a wide range of styles, features and costs among different sunglasses. It is not uncommon to see sunglasses as cheap as $4.99 or as expensive as $250.00. Of course, the varying costs and markets of sunglasses present trouble for a consumer in that it is often impossible for a consumer to test the effectiveness of a pair of sunglasses for their intended purpose while at a retail location. For example, a beachgoer cannot accurately test the effectiveness of a pair of sunglasses for use on the beach while standing in a large "box store" or other retail location. As such, there exists a need for an invention that allows for the comparison of one pair of sunglasses to another in "real world" situations. For instance, if the consumer is trying to determine which of two pair of sunglasses is better in terms of lens clarity, the amount of UV rays blocked, and glare control, being able to test the sunglasses against the actual intensity of the sun in a given environment will be greatly beneficial. Also, it will be helpful in determining if the lenses of a pair of sunglasses are better suited for morning or evening sunlight, on the beach or in the mountains. This will allow the consumer to truly know, before the purchase, which will be the better buy for their individual needs. Buying better suited and quality sunglasses will lead to optimum eye health. For sunglasses manufacturers and optometrists, the present invention will be beneficial because they will be able to prove the effectiveness of their sunglasses in a variety of environments.

SUMMARY OF INVENTION

In a first aspect, the present disclosure provides an apparatus for the testing and evaluation of sunglasses comprising a round base comprising a non-skid surface configured to be in contact with a floor and a pedal; a vertical member comprising a plurality of teeth engaged by one or more gears, wherein said gears are components of a height adjustment mechanism, wherein said height adjustment mechanism further comprises a pedal attached to the round base such that when a consumer applies pressure to the pedal, the gears engage the teeth and a viewing box attached to the vertical member may be lowered or raised; and the viewing box comprising a curved viewing screen, a projector and a non-transitory tangible media containing software or firmware encoded thereon for operation by one or more processors, said processors being programmed to perform the steps of: (i) receiving input from the customer or a database relating to the type of sunglasses to be tested and evaluated, (ii) receiving input from a customer relating to a desired image to be displayed by the projector, (iii) causing the projector to display the desired image, and (iv) allowing the customer to select other customer defined variables selecting from the time of day of the desired image and amount of light to be displayed in the desired image.

BRIEF DESCRIPTION OF THE DRAWINGS

To further the advantages and features of the present application, a more particular description of the invention will be rendered by reference to specific embodiments thereof which are illustrated in the appended drawings. It should be noted that identical features in different drawings are shown with the same reference numeral. It is appreciated that these drawings are not to be considered limiting in scope. The invention will be described and explained with additional specificity and detail through the use of the accompanying drawings in which.

DETAILED DESCRIPTION

Definitions

With reference to the use of the word(s) "comprise" or "comprises" or "comprising" in the following description and claims, unless the context requires otherwise, those words are used on the basis and clear understanding that they are to be interpreted inclusively, rather than exclusively, and that each of those words is to be so interpreted.

The term "about" as used herein refers to a value that may vary within the range of expected error inherent in typical measurement techniques known in the art.

The term "storage device" as used herein refers to a machine-readable device that retains data that can be read by mechanical, optical, or electronic means, for example by a computer. Such devices are sometimes referred to as "memory," although as used herein a machine-readable data storage device cannot comprise a human mind in whole or in part, including human memory. A storage device may be classified as primary, secondary, tertiary, or off-line storage. Examples of a storage device that is primary storage include the register of a central processing unit, the cache of a central processing unit, and random-access memory (RAM) that is accessible to a central processing unit via a memory bus (generally comprising an address bus and a data bus).

Primary storage is generally volatile memory, which has the advantage of being rapidly accessible. A storage device that is secondary storage is not directly accessible to the central processing unit, but is accessible to the central processing unit via an input/output channel. Examples of a storage device that is secondary storage include a mass storage device, such as a magnetic hard disk, an optical disk, a drum drive, flash memory, a floppy disk, a magnetic tape, an optical tape, a paper tape, and a plurality of punch cards. A storage device that is tertiary storage is not connected to the central processing unit until it is needed, generally accessed robotically. Examples of a storage device that is tertiary storage may be any storage device that is suitable for secondary storage, but configured such that it is not constantly connected to the central processing unit. A storage device that is off-line storage is not connected to the central processing unit, and does not become so connected without human intervention. Examples of a storage device that is off-line storage may be any storage device that is suitable for secondary storage, but configured such that it is not constantly connected to the central processing unit, and does not become so connected without human intervention. Secondary, tertiary, and offline storage are generally non-volatile, which has the advantage of requiring no source of electrical current to maintain the recorded information. A storage device cannot be construed to be a mere signal, although information may be communicated to and from a storage device via a signal.

The term "processor" or "central processing unit" (CPU) as used herein refers to a software execution device capable of executing a sequence of instructions ("program"). The CPU comprises an arithmetic logic unit, and may further comprise one or both of a register and cache memory.

The term "machine-readable format" as used herein refers to a medium of storing information that is configured to be read by a machine or processor. Such formats include magnetic media, optical media, and paper media (punch cards, paper tape, etc.). Printed writing in a human language, if not intended or configured to be read by a machine, is not considered a machine readable format. In no case shall a human mind be construed as "machine readable format."

The term "database" as used herein refers to an organized data structure comprising a plurality of records stored in machine-readable format.

Sunglass Testing Station

In one embodiment, the present disclosure provides a sunglass testing station 10 that is useful in determining the effectiveness and desirability of a pair of sunglasses in "real world" environments. For example, if a consumer desires to purchase a new pair of sunglasses before an alpine skiing trip, the sunglass testing station 10 is adapted to allow the consumer to "preview" the effectiveness and desirability of potential sunglasses in an alpine environment where glare as a result of redirected sunlight is a significant problem.

Figure 1:
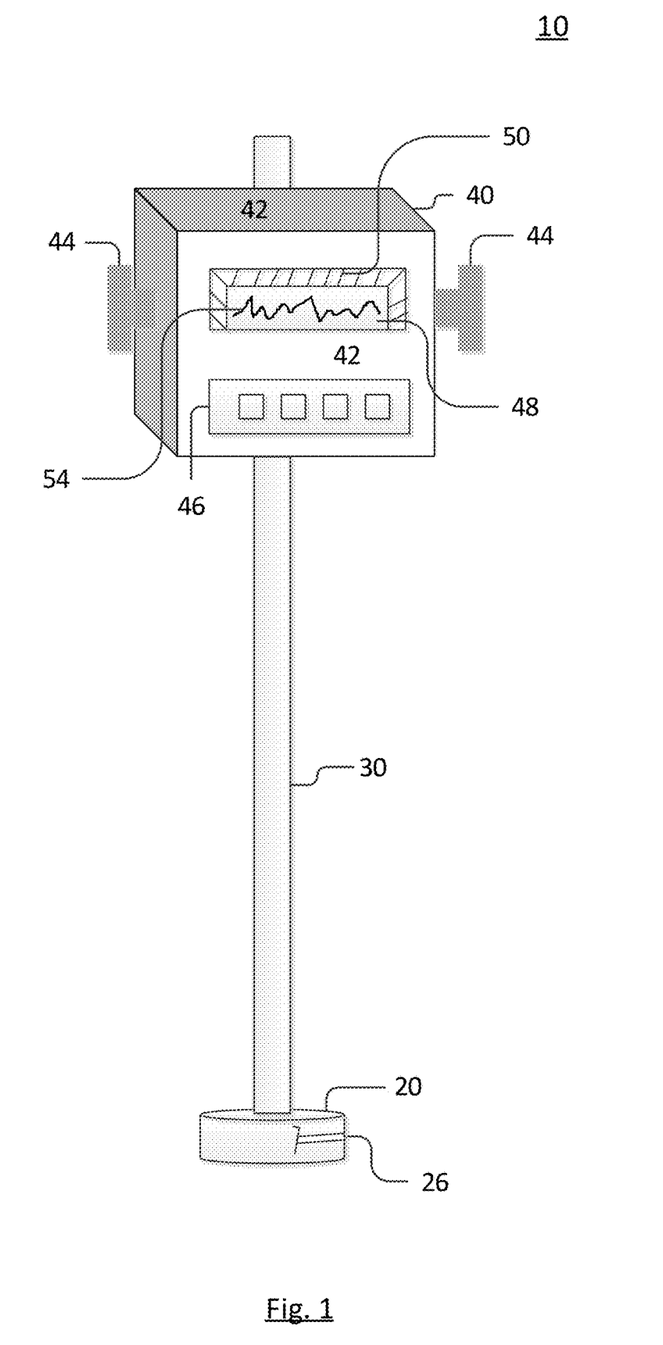
FIG. 1 shows a front perspective view of one embodiment of the sunglass testing station disclosed herein.
Figure 2:
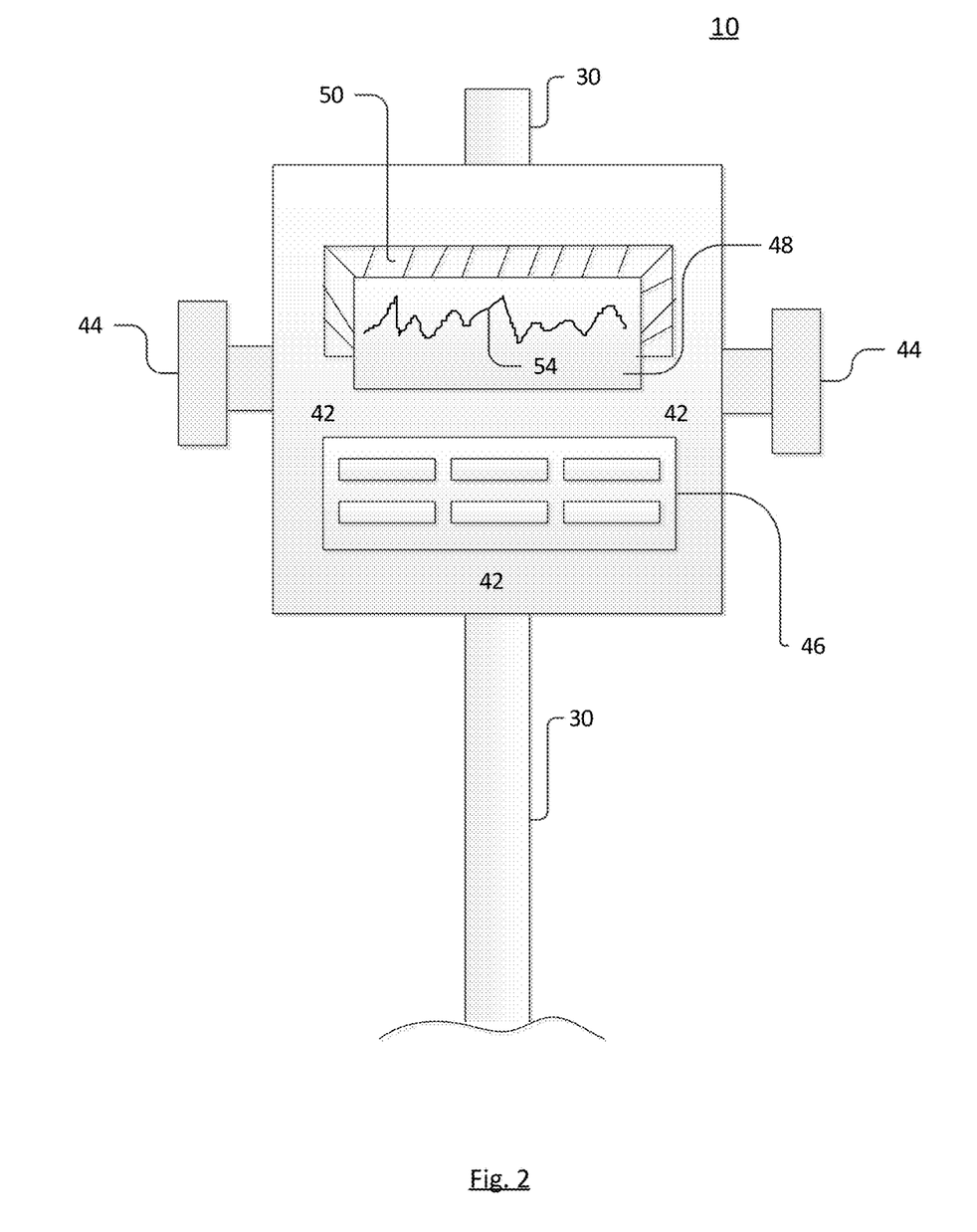
FIG. 2 shows a front view of one embodiment of the sunglass testing station disclosed herein.

In one embodiment, the sunglass testing station 10 comprises a base 20, a vertical member 30 and a viewing box 40 as shown in FIGS. 1 and 2.

The base 20 may be of several suitable shapes, sizes and designs. In one embodiment, the base 20 is round or oval. Other shapes should be considered within the scope of this disclosure including square or rectangular shapes. The base 20 must provide enough mass to stabilize and essentially anchor the sunglass testing station 10 during use. Additionally, the base 20 must provide enough mass to stabilize the sunglass testing station 10 in a retail environment as to prevent the sunglass testing station 10 from tipping over if a consumer accidently brushes against or contacts the sunglass testing station 10.

In one embodiment, the base 20 comprises a non-skid surface 22 that is applied to the surface of the base 20 in contact with the floor. The non-skid surface 22 is adapted to stabilize the sunglass testing station 10 during use and prevents the sunglass testing station 10 from tipping over if a consumer accidently brushes against or contacts the sunglass testing station 10. In an alternate embodiment, the base 20 further comprises a pedal 26 that is used in connection with a height adjustment mechanism 24 as described herein below.

In one embodiment, the sunglass testing station 10 comprises a vertical member 30. The vertical member 30 may be a "pole" which is connected to the base 20 on a first end and is in engagement with the viewing box 40. In one embodiment, the vertical member 30 is about 6 feet 5 inches in length (195.6 cm). Although other desirable lengths should be considered in the scope of this disclosure to provide a desirable range of movement of the viewing box 40 along the longitudinal axis of the vertical member 30. In one embodiment, the vertical member 30 further comprises a plurality of teeth engaged with one or more gears that comprise the height adjustment mechanism as described herein below. In one embodiment, the vertical member 30 is attached to the rear surface of the viewing box 40 while in other embodiments the vertical element 30 may pass through the interior of the viewing box 40.

The sunglass testing station 10 further comprises a viewing box 40. In one embodiment, the viewing box 40 further comprises an outer shell 42 and one or more handles 44. In one embodiment, the outer shell 42 is shaped as a square or a rectangle. Of course, other shapes should be considered within the scope of this disclosure. In one embodiment, the one or more handles 44 are positioned on opposite sides or surfaces of the viewing box 40. The handles 44 serve several purposes. First, they provide a means for the consumer to help adjust the height of the viewing box 40. Additionally, the handles provide a place for the consumer to place their hands while using the sunglass testing station 10.

In one embodiment, the viewing box 40 further comprises a height adjustment mechanism 24 adapted to allow the viewing box 40 to be positioned on the vertical member 30 to a desired height for use of the sunglass testing station 10. In one embodiment, the height adjustment mechanism 24 comprises a series of gear(s) and teeth (not shown) and a pedal 26, wherein the pedal is located on the base 20. In one embodiment, the gear(s) may be located in the rear of the viewing box 40 and are adapted to engage the plurality of teeth located on the vertical member. When a consumer desires to adjust the height of the viewing box 40, the consumer may depress the pedal 26 with his foot and the gear(s) disengage from the teeth. In one embodiment, the pedal 26 is connected to the gear(s) through a cable connection such that when the pedal 26 is depressed, sufficient force is imparted to the gear(s) to cause them to disengage from the teeth. With the pedal 26 depressed and the gear(s) disengaged from the teeth, the consumer may adjust the height of the viewing box 40 along the longitudinal axis of the vertical member 30 to a comfortable height. In one embodiment, the height adjustment mechanism 24 includes a safety (not shown) to prevent the viewing box 40 from "crashing" to the floor if the pedal 26 is depressed accidentally by a consumer or by a consumer while not holding the handles 44.

In one embodiment, the viewing box 40 further comprises a touch screen 46. In some embodiments, the touch screen 46 comprises a graphical user interface (GUI) 48, one or more processors, memory and one or more modules, programs or sets of instructions stored in the memory for performing multiple functions. In some embodiments, the consumer interacts with the GUI 48 primarily through finger contacts and gestures on the touch-sensitive display. The touch screen 46 provides an input interface and an output interface between the consumer and the sunglass testing station 10. A touch-sensitive display in some embodiments of the touch screen 46 may be analogous to the multi-touch sensitive tablets described in the following: U.S. Pat. No. 6,323,846 (Westerman et al.), U.S. Pat. No. 6,570,557 (Westerman et al.), and/or U.S. Pat. No. 6,677,932 (Westerman), and U.S. Patent Publication 2002/0015024A1. The touch screen 46 may have a resolution in excess of 100 dpi. In an exemplary embodiment, the touch screen has a resolution of approximately 160 dpi. The consumer may make contact with the touch screen 46 using any suitable object or appendage, such as a stylus, a finger, and so forth. In some embodiments, the touch screen 46 is designed to work primarily with finger-based contacts and gestures, which are much less precise than stylus-based input due to the larger area of contact of a finger on the touch screen. In some embodiments, the touch screen 46 translates the rough finger-based input into a precise pointer/cursor position or command for performing the actions desired by the user.

Figure 3:
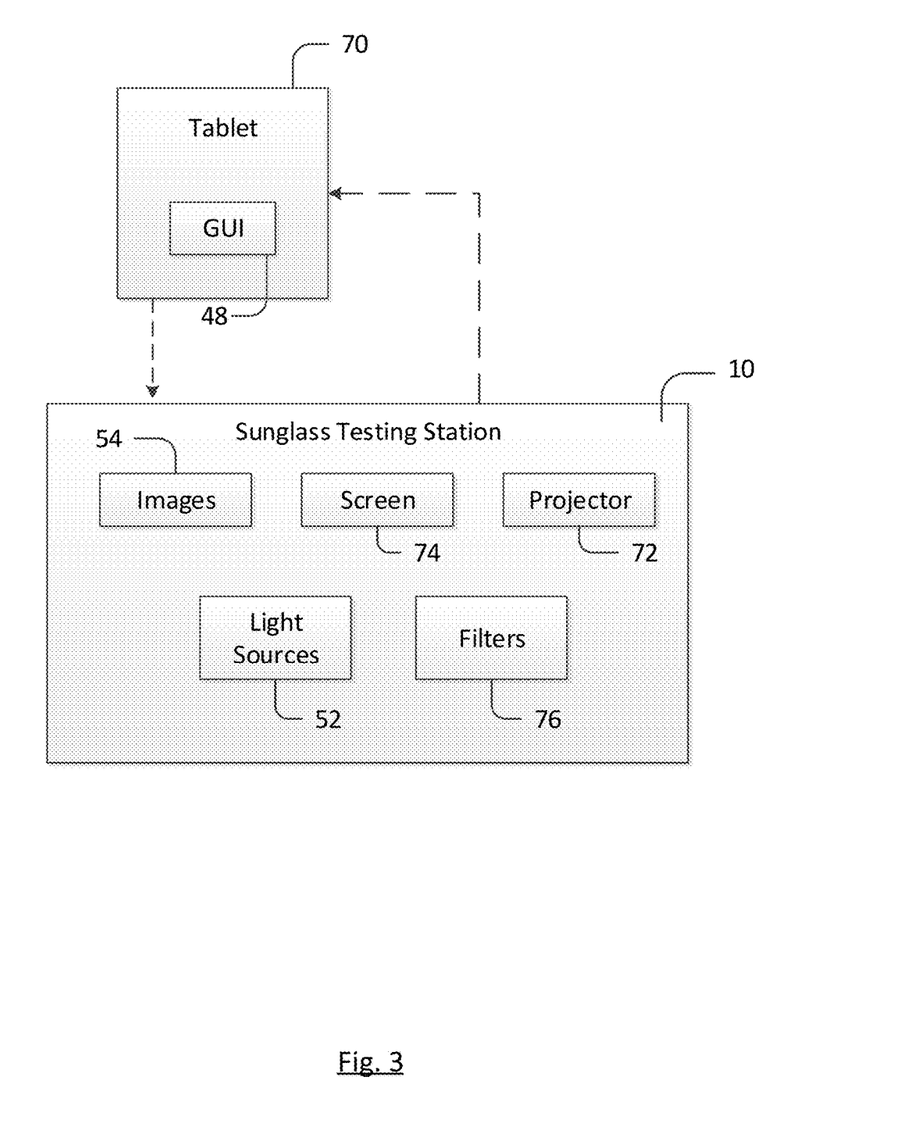
FIG. 3 shows a functional diagram of the elements of one embodiment of the sunglass testing station disclosed herein.

In an alternate embodiment as shown in FIG. 3, the sunglass testing station 10 comprises a tablet 70 (such as the Apple iPAD®, Samsung GALAXY® or the Dell VENUE®) which is in communication with sunglass testing station 10. Additionally, other personal electronic devices such as the Apple iPHONE® may be use instead of or in addition to the tablet 70. In this embodiment, the user input functions described above implemented by the GUI 48 are carried out by and through certain software and firmware on the tablet 70.

The tablet 70 may be in communication with the sunglass testing station 10 via a lower power communications link such as a Bluetooth® link or in an alternate embodiment the tablet may be physically connected to the sunglass testing station 10 via a communications cable.

The tablet 70 allows a consumer to control the image 54 displayed by the sunglass testing station 10. For example, if a consumer wishes to purchase a new pair of glasses for skiing, they could interact with the interface present on the table 70 and select a scene that mimics an alpine ski setting in which they could test the effectiveness of the glasses.

The touch screen 46 and the GUI 48 which comprises an input interface and an output interface allow the consumer to select from among various scenes to be displayed in the viewing window 50. For example, if a fisherman desires to purchase new sunglasses for fishing, the touch screen 46 and input interface and an output interface allow the fisherman to select an environment (such as a lake) with similar visible and UV conditions that the fisherman would encounter while using the sunglasses fishing. As such, the effectiveness of the sunglasses for their desired use can be determined.

In one embodiment, the viewing box 40 further comprises a light source 52 and a CPU capable of creating and displaying an image 54 for viewing by the consumer. CPU can be any conventional computer processor or other graphics imaging device commonly used in the industry to produce or reproduce real photographs, computer generated or virtual reality images 54 including still scenes or motion video depicting realistic scenarios involving situations wherein a consumer would normally be exposed to sunlight. Common scenarios generated could involve recreational activities such as boating, bicycling, skiing, and other outdoor activities such as gardening or construction where sunlight is generally present and reflected off a variety of surfaces such as metallic objects, water, and snow. The generated images are displayed in a viewing window 50 capable of sufficient resolution to depict such realistic scenes. The graphics capability of the CPU must be sufficient to generate motion pictures, normal still photographs or virtual reality images including a large variety of colors and include shading, reflectivity, and other lighting effects. Control of brightness and contrast of the image can be accomplished in a conventional manner through an on-screen menu or through a button driven panel on the monitor. Images that are generated will also reflect a variety of circumstances an observer will encounter throughout the day and include varying light intensities from very dim light to very bright light or glare.

In one embodiment, the viewing window 50 is substantially flat while in other embodiments the viewing window 50 may be curved (either convex or concave). The curved viewing window 50 may aid in the presentation of a realistic panoramic view of the image 54.

The light source 52 may be a single light or a series of lights, such as incandescent or fluorescent lights, or any light capable of producing light in the visible spectrum and powered by conventional means. The lights are constructed with variable intensity settings and may be controlled through such means as a dimmer switch commonly known throughout the electrical industry which may be controlled by the CPU. It will be appreciated that other conventional means could be used to vary the intensity of the lighting. While the light source 52 itself may be sufficient to cause discomfort to the viewer, alternate sources of irritation are also inherent in the system. For instance, the reflective glare off the screen from the illumination source may cause some discomfort. Additionally, the computer generated images may produce an amount of discomfort due to the brightness programmed into the images.

In one embodiment, the light source 52 is located or housed in a small (or mini-) projector 72. The projector 72 is controlled by either the CPU or the tablet 70 and is capable of displaying or projecting various images 54 desired by customers to test sunglasses. In one embodiment, the projector 72 is in communication with the tablet 70 and is controlled by the tablet 70. Thus, when as described above a consumer wishes to test the effectiveness of snow skiing glasses and selects such a scene via the tablet 70, the projector 72 displays the alpine ski setting.

The image 54 displayed by the projector 72 may be displayed on a screen 74 in front of the projector 72. In one embodiment, the screen 74 may be rectangular and essentially flat. In alternate embodiments, the screen may be curved such that the ends of the screen 74 are closer to the projector 72 than the middle of the screen 74. The curved screen 74 is particularly useful in displaying paranoramic images 54 which may be more life-like than an image 54 projected onto a flat screen 74.

In one aspect, the sunglass testing station 10 may also include a plurality of light sources 52 wherein at least one of the light sources 52 is used to project or display the image 54 and at least one other light source 52 is used to create life-like viewing circumstances for the consumer (such as introducing glare). The glare producing light source 52 may be positioned behind, to the side of or potentially in front of the image 54 being displaying by the projector 72. It is believed that a light source 52 present behind the screen 74 on which the projector is displaying an image 54 will be particularly useful in creating circumstances where glare needs to be reduced by the sunglasses being tested. This glare inducing light source 52 may also be moveable in that it may track or mimic the trajectory of the sun as it progresses from morning to dark. This movement allows a consumer to test the effectiveness of the sunglasses in a variety of light conditions form morning to dark. In an alternate embodiment, the glare may be produced by mirrors reflecting light from the projector 72, or a combination of mirrors and glare producing light sources 52.

Finally, the light produced by the light source 52 may pass through one or more filters 76 which are adapted to once again mimic different real-world scenarios.

In one embodiment, the viewing box 40 may further comprise a shield (not shown) adapted to shield the viewing window 50 from ambient light. The shield (not shown) thus serves to allow the consumer to accurately judge the effectiveness of the sunglasses being tested. The shield (not shown) also serves to prevent ambient light from interfering with the consumer's viewing of the images. The shield (not shown) may be small or it may be relatively large, similar to a hood.

FIGS. 4 through 8 show an alternate embodiment of the sunglass testing station 10 in accordance with the present disclosure. In this embodiment, the sunglass testing station 10 comprises a charging base 100 and a viewing sphere 102. The sphere 102 includes a display 104 for viewing images, which may be curved as described above with respect to alternate embodiments. The display 104 may also utilize a curved or "fish eye" lens 106 to enhance a consumer's viewing experience. Although not shown, other configurations of the sunglass testing station 10 may be used, such as a system 10 that includes all components in a handheld form, a system 10 that includes all components in a wearable, goggle-like structure, or a system 10 that includes all components in a single, tabletop structure.

Figure 4:
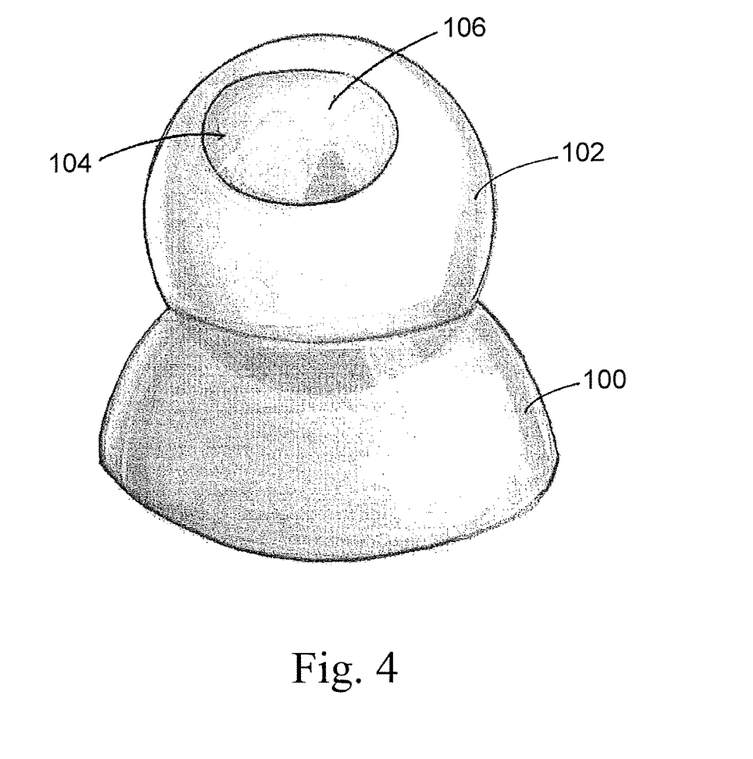
FIG. 4 shows a front perspective view of one embodiment of the sunglass testing station disclosed herein.

As shown in FIG. 4, the sphere 102 and charging base 100 may be comprised of any number of materials. For example, the sphere 102 may be comprised of chrome or other metal, while the charging base 100 may be comprised of a plastic material. Any combination or configuration of these or other materials may be used or added, such as silicone, glass, acrylic, and the like, depending on aesthetic preference.

Although FIG. 4 shows the sphere 102 and charging base 100 in certain configurations, it should be understood that the present disclosure includes other shapes and configurations as possibilities for these components. For example, the sphere 102 may instead be a cube, oblong shape, or any other type of three-dimensional object, so long as it provides a display 104 to accomplish the purpose of sunglass testing station 10. Similarly, the charging base 100 may be configured in a wide range of shapes and sizes, depending on the shape of the sphere 102.

Figure 5:
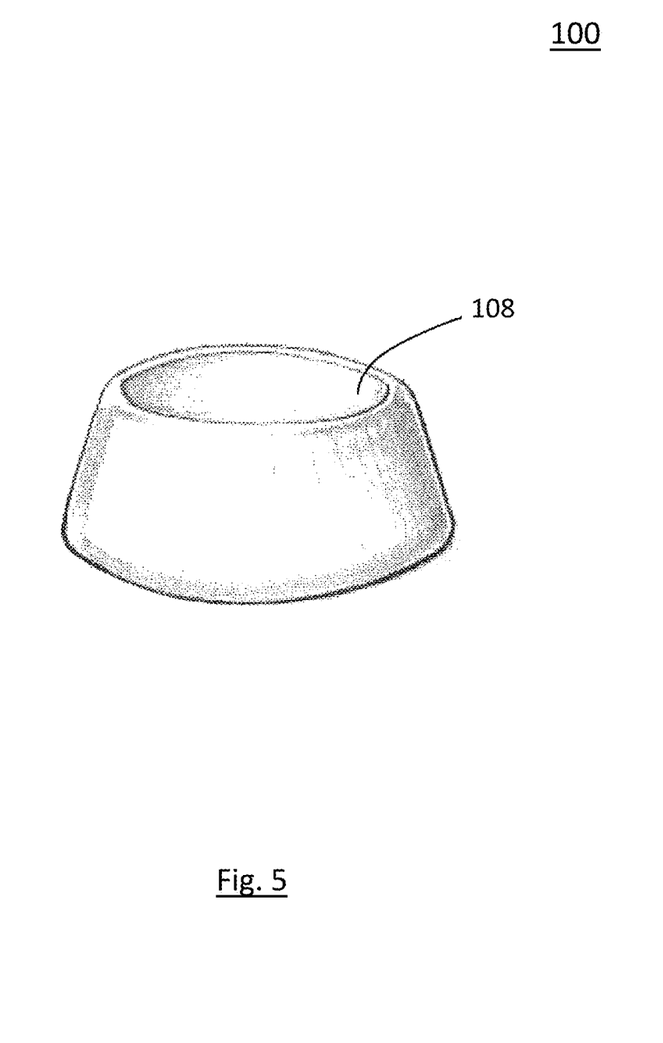
FIG. 5 shows a front perspective view of a charging base in accordance with one embodiment of the sunglass testing station disclosed herein.

FIG. 5 shows a front perspective view of a charging base 100 in accordance with one embodiment of the sunglass testing station 10. In this embodiment, the charging base 102 includes a concave stand 108 configured to hold the sphere (not shown). This concave stand 108 may be shaped such that it provides a complementary fit to the outer surface of the sphere (not shown).

Figure 6:
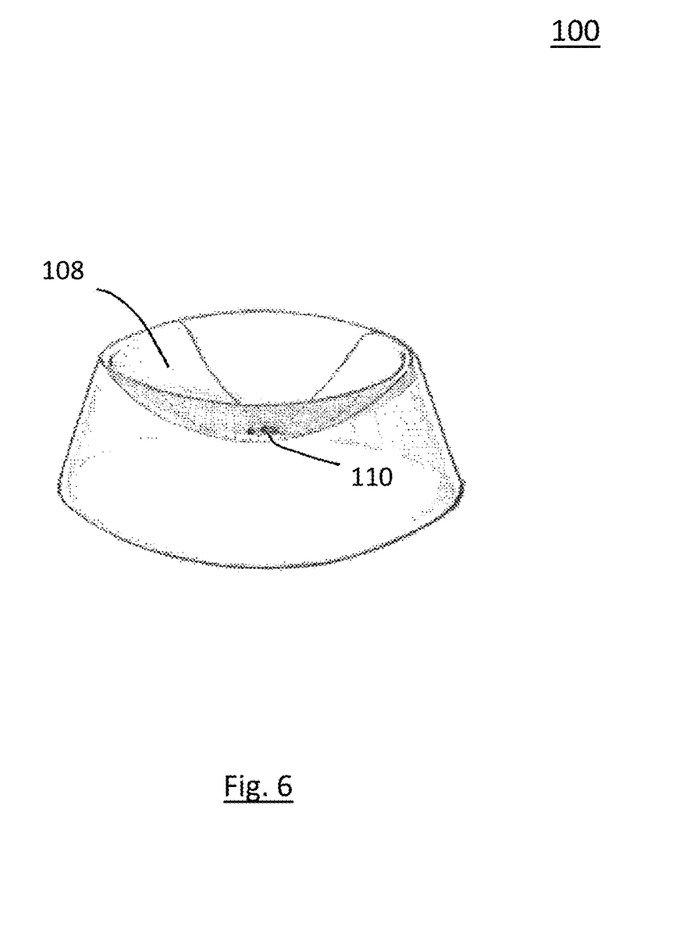
FIG. 6 shows a front perspective view of a charging base in accordance with one embodiment of the sunglass testing station disclosed herein.

FIG. 6 shows a front perspective view of a charging base 100 in accordance with one embodiment of the sunglass testing station 10. In this embodiment, the charging base 100 may provide the capability to wirelessly charge a battery (not shown) in the sphere (not shown). This capability provides many advantages, allowing the sphere (not shown) to maintain a sleek appearance as well as added mobility. In this manner, the charging base 100 may include a concave stand 108 configured to hold the sphere (not shown), similar to any wired concave stand (not shown). However, the concave stand 108 in this embodiment comprises a charging contact 110 configured to make contact with a complementary charging surface (not shown) located on the sphere (not shown).

Although the charging contact 110 shown in this embodiment is located at the concentric base of the concave stand 108, the charging contact 110 may be located anywhere on the surface of the concave stand 108 so long as it has the ability to make contact with the complementary charging surface (not shown) located on the sphere (not shown). Positioning the charging contact 110 at the concentric base of the concave stand 108 may be advantageous, however. If the complementary charging surface (not shown) located on the sphere (not shown) is at the concentric base of the sphere (not shown), the charging contact 110 will make contact with the complementary charging surface (not shown) no matter which direction the sphere (not shown) is oriented when it is set on the concave stand 108.

Figure 7:
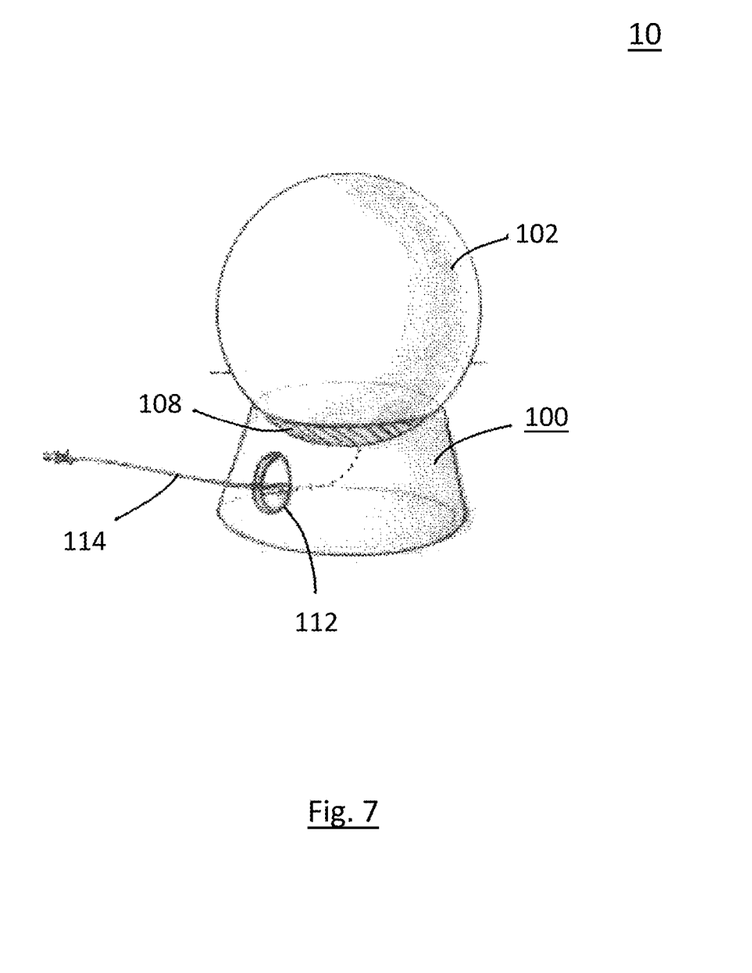
FIG. 7 shows a rear perspective view of one embodiment of the sunglass testing station disclosed herein.

FIG. 7 shows a rear perspective view of a sunglass testing station 10 in accordance with one embodiment of the present disclosure. In this embodiment, the sphere 102 is shown using an electrical cord 114 for its power supply. The electrical cord 114 may be connected to the sphere 102 directly. In this manner, the concave stand 108 may comprise an opening (not shown) which allows the electrical cord 114 attached to the sphere 102 to pass through the concave stand 108. In turn, the charging base 100 may also comprise an opening 112 which allows the electrical cord 114 to pass through the charging base 100 and out toward an electrical outlet (not shown).

In one embodiment, the charging base 100 may be provided power by an electrical cord 114, but the sphere 102 itself may be wireless. In this manner, the electrical cord 114 may attach to the underside of the concave stand 108 in order to provide power for charging. In turn, the concave stand 108 may comprise a charging contact (not shown) for making contact with a complementary charging surface (not shown) located on the sphere 102, as further described above with respect to FIG. 6.

Figure 8:
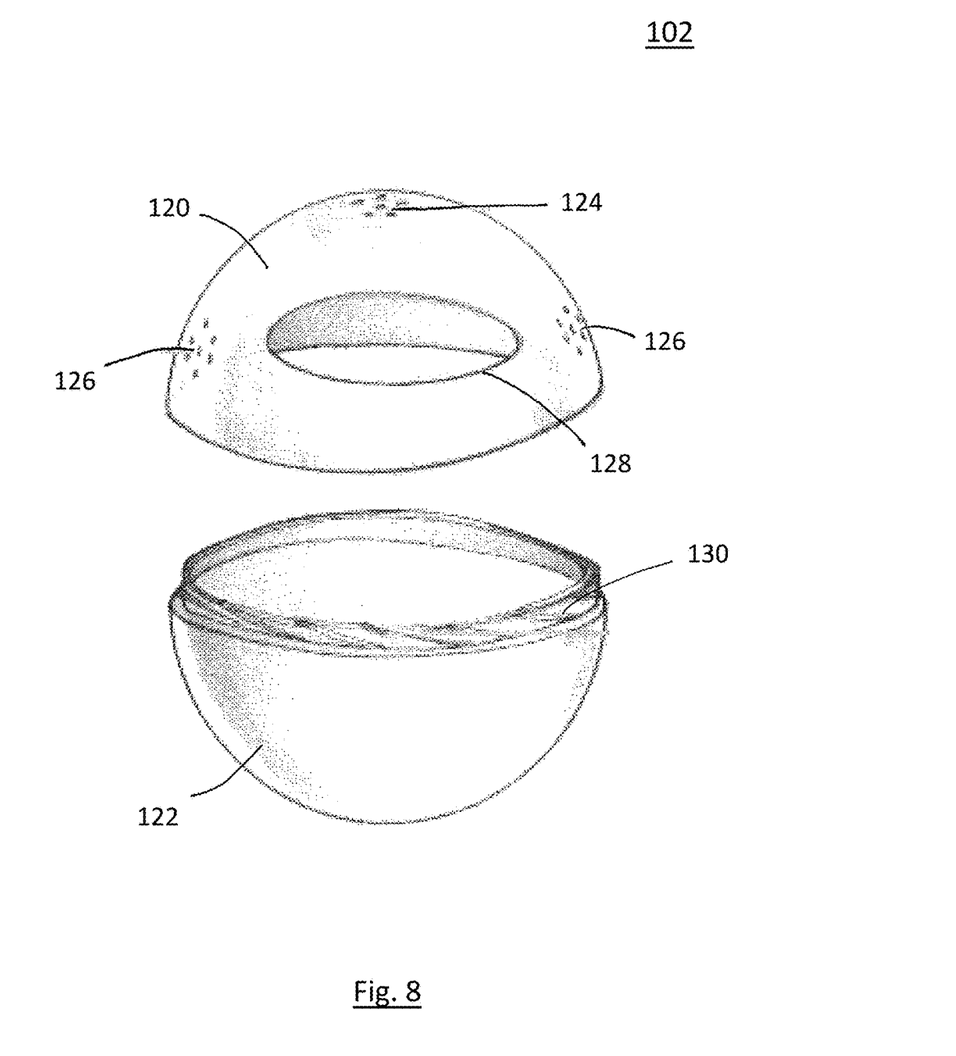
FIG. 8 shows an exploded front perspective view of a viewing sphere in accordance with one embodiment of the sunglass testing station disclosed herein.

FIG. 8 shows an exploded front perspective view of the sphere 102 in accordance with one embodiment of the sunglass testing station 10. In this embodiment, the sphere 102 comprises an upper hemisphere 120 and a lower hemisphere 122 for ease of interior maintenance. The upper hemisphere 120 and lower hemisphere 122 are shown as being divided equally along a horizontal plane, but other divisions are contemplated by the present disclosure. In one embodiment, the lower hemisphere 122 may be attached to the upper hemisphere 120 by the use of threads 130 which have complementary grooves (not shown) on the interior of the upper hemisphere 120. Similar to a commonly-used bottle cap, the two halves of the sphere 102 may be twisted together such that they are affixed to one another. Although this embodiment shows the use of threads 130, many other mechanisms may be used to fasten the upper hemisphere 120 to the lower hemisphere 122.

In one embodiment, the sphere 102 may comprise features which enhance the consumer experience. For example, the sphere 102 may include a fan system 124 which simulates the feeling of wind or air when a consumer is viewing particular images or scenarios. Additionally, the sphere 102 may include audio speakers 126 so that sound may accompany various images or scenarios that a consumer may view through the display window 128. The present disclosure contemplates various positions or locations of the fan system 124 and speakers 126 so it is understood the sunglass testing station 10 is not limited by the positions shown in FIG. 8.

Although FIG. 8 does not show the interior components of the sunglass testing station 10, it is understood that the components and their respective uses are similar to those described with respect to other embodiments disclosed herein. In addition, the sphere 102 may include an accelerometer (not shown) to enhance the consumer's viewing experience. In this manner, the accelerometer (not shown) may be linked to the images displayed such that movement by the consumer affects the image viewed. Other interior components described above may also be included. For example, the sphere 102 may include a curved display 104, or may instead utilize a projection method (not shown) or flat LCD screen (not shown) for displaying images. Other hardware elements (not shown) may include a touch screen (not shown), capability to interface with a personal or other remote device, internet connectivity, and alternate light sources (not shown).

Use

The sunglass testing station 10 maybe be used in any manner known to those of ordinary skill in the art. By way of example, and without being limited to this disclosure, a consumer may use the sunglass testing station 10 in the following manner: (i) selecting one or more pairs of sunglasses for testing; (ii) adjusting the height of the sunglass testing station 10 as described herein so that the viewing window 50 is approximately eye level; (iii) selecting, via the touch screen 46 the environment(s) to be tested, such as the beach, the lake, an alpine environment, etc.; (iv) viewing the image 54 through the sunglasses to be tested; and (v) determining whether the sunglasses are acceptable or selecting another pair of sunglasses for testing.

In one embodiment, the sunglasses testing station 10 further comprises a scanning means 60 capable of scanning and reading the bar code that a retailer has associated with a particular pair of sunglasses. In one embodiment, the scanning means 60 comprises a database 62 wherein certain characteristics of and about the sunglasses are stored including the materials that comprise the sunglasses, impact resistance, a photograph of the sunglasses to confirm that the correct sunglasses have been associated with the database 62, marketing materials desired by the sunglasses manufacturer and the most effective environment for the sunglasses.

In one embodiment, the scanning means 60 further comprises an illumination system 64, a sensor 66, converter 67 and a decoder 68. In one exemplary embodiment, the scanning means 60 functions as described below. Of course other scanning means 60 with other modes of operation should be considered within the scope of this disclosure. Barcode scanners begin by illuminating the code with red light produced by the illumination system 64. The sensor 66 detects the reflected light and generates an analog signal with varying voltage that represents the intensity (or lack of intensity) of the reflection. The converter 67 changes the analog signal to a digital signal which is fed to the decoder 68. The decoder 68 interprets the digital signal, does the calculations required to confirm and validate that the barcode is decipherable, converts it into ASCII text, formats the text and sends it to the CPU to which the scanning means 60 is attached. A myriad of illumination systems may be employed by the scanning means 60 including LED imagers, lasers, linear multiple LED and single point LED.

Some the components of the above-described system may be implemented with computers. A computer may be any CPU controlled device, such as, by way of example, personal computers, workstations, servers, clients, mini-computers, main-frame computers, laptop computers, a network of one or more computers, mobile computers, portable computers, handheld computers, palm top computers, set top boxes for a TV, interactive televisions, interactive kiosks, personal digital assistants, interactive wireless devices, mobile browsers, or any combination thereof. The computer may possess input devices such as, by way of example, a keyboard, a keypad, a mouse, a microphone, or a touch screen, and output devices such as a computer screen, printer, or a speaker.

The computer may be a single or multiple CPU machine. Additionally, the computer includes memory. The memory may be in forms such as, by way of example, primary, secondary or tertiary, and other devices or technologies to transmit or store electronic content such as programs and data.

The computer executes an appropriate operating system such as Linux, Unix, Microsoft® Windows® 95, Microsoft® Windows® 98, Microsoft® Windows® NT, Apple® MacOS®, IBM® OS/2®, and Palm® OS, and embedded operating systems such as Windows® CE or and the like. The computer may advantageously be equipped with a network communication device such as a network interface card, a modem, or other network connection device suitable for connecting to one or more networks.

The computer, and the memory, may advantageously contain control logic, or program logic, or other substrate configuration representing data and instructions, which cause the computer to operate in a specific and predefined manner as, described herein. In particular, the computer programs, when executed, enable the CPRU to perform and/or cause the performance of features of the present invention. The control logic may advantageously be implemented as one or more modules and is in a machine readable format. The modules may advantageously be configured to reside on the memory and execute on the one or more CPUs. The modules include, but are not limited to, software or hardware components that perform certain tasks. Thus, a module may include, by way of example, components, such as, software components, processes, functions, subroutines, procedures, attributes, class components, task components, object-oriented software components, segments of program code, drivers, firmware, micro-code, circuitry, data, and the like.

The control logic conventionally includes the manipulation of data bits by the CPU and the maintenance of these bits within data structures resident in one or more of the memory storage devices. Such data structures impose a physical organization upon the collection of data bits stored within computer memory and represent specific electrical or magnetic elements. These symbolic representations are the means used by those skilled in the art to effectively convey teachings and discoveries to others skilled in the art.

The control logic is generally considered to be a sequence of computer-executed steps. These steps generally require manipulations of physical quantities. Usually, although not necessarily, these quantities take the form of electrical, magnetic, or optical signals capable of being stored, transferred, combined, compared, or otherwise manipulated. It is conventional for those skilled in the art to refer to these signals as bits, values, elements, symbols, characters, text, terms, numbers, records, files, or the like. It should be kept in mind, however, that these and some other terms should be associated with appropriate physical quantities for computer operations, and that these terms are merely conventional labels applied to physical quantities that exist within and during operation of the computer.

It should be understood that manipulations within the computer are often referred to in terms of adding, comparing, moving, searching, or the like, which are often associated with manual operations performed by a human operator. It is to be understood that no involvement of the human operator may be necessary, or even desirable. The operations described herein are machine operations performed in conjunction with the human operator or user that interacts with the computer or computers.

It should also be understood that the programs, modules, processes, methods, and the like, described herein are but an exemplary implementation and are not related, or limited, to any particular computer, apparatus, or computer language. Rather, various types of general purpose computing machines or devices may be used with programs constructed in accordance with the teachings described herein.

While the invention has been described with respect to a limited number of embodiments, those skilled in the art, having benefit of this disclosure, will appreciate that other embodiments can be devised which do not depart from the scope of the invention as disclosed here.

I claim:

1. An apparatus for the testing and evaluation of sunglasses comprising:
   a. a round base comprising a non-skid surface configured to be in contact with a floor and a pedal;
   b. a vertical member comprising a plurality of teeth engaged by one or more gears, wherein said gears are components of a height adjustment mechanism, wherein said height adjustment mechanism further comprises a pedal attached to the round base such that when a consumer applies pressure to the pedal, the gears engage the teeth and a viewing box attached to the vertical member may be lowered or raised; and
   c. a viewing box comprising a curved viewing screen, a projector and a non-transitory tangible media containing software or firmware encoded thereon for operation by one or more processors, said processors being programmed to perform the steps of: (i) receiving input from the customer or a database relating to the type of sunglasses to be tested and evaluated, (ii) receiving input from a customer relating to a desired image to be displayed by the projector, (iii) causing the projector to display the desired image, and (iv) allowing the customer to select other customer defined variables selecting from the time of day of the desired image and amount of light to be displayed in the desired image.

2. The apparatus of claim 1 wherein the customer inputs of step (c) are receiving through a graphical user interface.

3. The apparatus of claim 2 wherein the graphical user interface is provided by a portable consumer electronic device in two-way communication with the non-transitory tangible media.

4. The apparatus of claim 3 wherein the projector displays the desired image on a screen, said screen being viewable by the customer.

5. The apparatus of claim 4 wherein the screen is curved such that the edges of the screen are closer to the projector than the middle of the screen.

6. The apparatus of claim 5 further comprising a source of glare inducing light that is separate and distinct from the projector.

7. The apparatus of claim 6 wherein the source of glare inducing light is positioned behind the screen.

* * * * *